(12) United States Patent
Buchberger et al.

(10) Patent No.: US 7,528,361 B2
(45) Date of Patent: May 5, 2009

(54) SEMICONDUCTOR OPTO DEVICE HAVING OPTODIODE WITH ADAPTED SPECTRAL SENSITIVITY

(75) Inventors: Rudolf Buchberger, Munich (DE); Jaime Estevez-Garcia, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/767,195

(22) Filed: Jun. 22, 2007

(65) Prior Publication Data

US 2007/0295889 A1   Dec. 27, 2007

(30) Foreign Application Priority Data

Jun. 22, 2006  (DE) ................. 10 2006 028 672

(51) Int. Cl.
*G01J 3/50* (2006.01)
*H01J 5/16* (2006.01)

(52) U.S. Cl. ..................................... 250/226; 356/406

(58) Field of Classification Search ............... 250/226, 250/239, 208.1, 229, 214.1; 356/405, 406; 348/308
See application file for complete search history.

(56) References Cited

U.S. PATENT DOCUMENTS

| 3,996,461 A | 12/1976 | Sulzbach et al. |
| 5,170,035 A | 12/1992 | Webster et al. |
| 7,132,644 B2 * | 11/2006 | Grunert et al. ............... 250/226 |

OTHER PUBLICATIONS

"Related Power Thyristors", S.M.: Physics of Semiconductor Devices, 2nd Issue, 1981, Paragraph 4.4. pp. 222-234.

* cited by examiner

*Primary Examiner*—Seung C Sohn
(74) *Attorney, Agent, or Firm*—Dicke, Billig & Czaja, PLLC

(57) ABSTRACT

A semiconductor opto device is disclosed. One embodiment provides an optodiode. The optodiode has a relative spectral sensitivity that is adapted to the relative spectral sensitivity of an eye, wherein, correspondingly adapted to the spectral sensitivity of the eye, a switch-on or switch-off process of the optothyristor or optotriac is triggered.

14 Claims, 2 Drawing Sheets

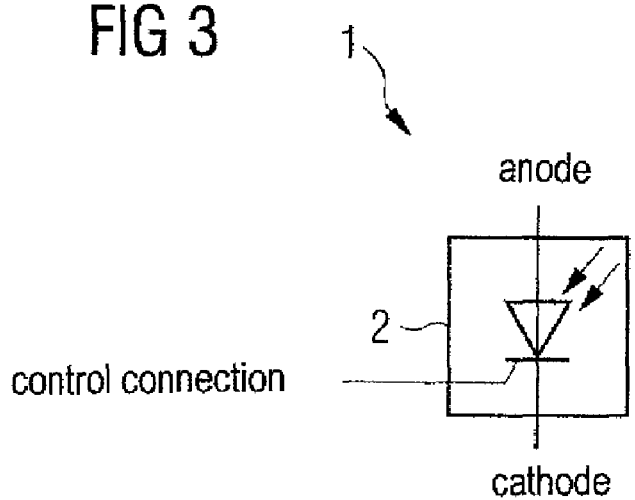
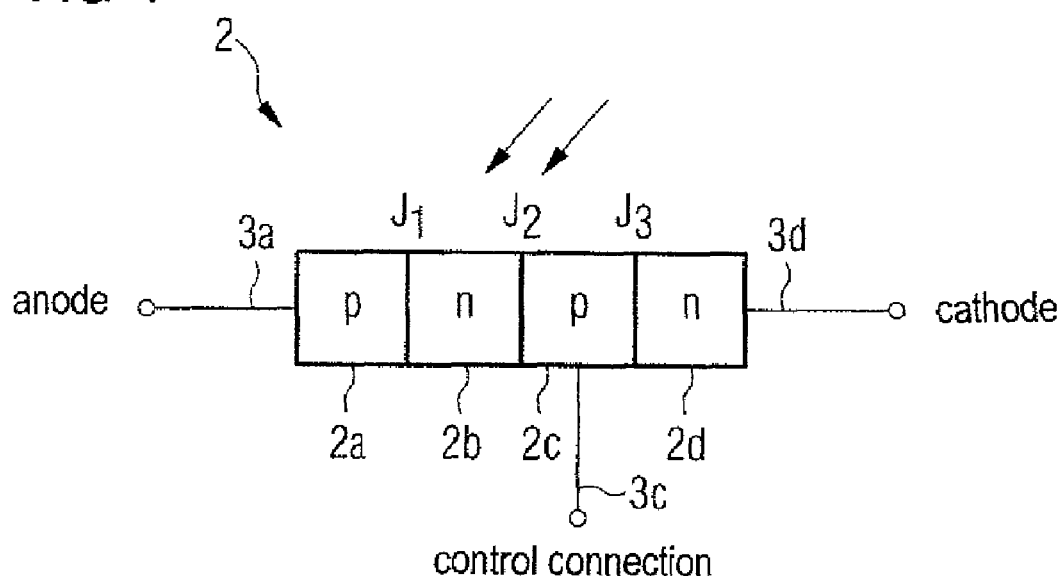

SEMICONDUCTOR OPTO DEVICE HAVING OPTODIODE WITH ADAPTED SPECTRAL SENSITIVITY

CROSS-REFERENCE TO RELATED APPLICATIONS

This Utility patent application claims priority to German Patent Application No. DE 10 2006 028 672.3 filed on Jun. 22, 2006, which is incorporated herein by reference.

BACKGROUND

The invention relates to semiconductor opto device.

In prior art, a plurality of different semiconductor devices are known, e.g., diodes, transistors, thyristors, triacs, etc.

Diodes are semiconductors that permit current to flow in one direction.

They include two connections, namely an anode and a cathode.

If a positive voltage is applied between the anode and the cathode, the diode is operated in conducting direction—a "forward current" will then flow through the diode.

If a negative voltage is applied between the anode and the cathode, the diode locks. The current flowing in locking direction during operation of the diode ("locking current") is in general substantially smaller than the current flowing in conducting direction during operation of the diode.

As the locking current of a diode becomes the larger the stronger the diode is exposed.

This effect is utilized for light measurement in the case of photodiodes.

Photodiodes may be incorporated in a package provided with a light-transmissive window, e.g., a glass window.

If the anode and the cathode are short-circuited in the case of a photodiode, a short-circuit (photo) current—that depends on the intensity of the exposure—will flow.

For operating a photodiode, the applying of an external voltage is thus not cogently necessary.

If a locking voltage is applied between the anode and the cathode of a photodiode, i.e. the diode is operated in locking direction, the current flowing through the diode will remain substantially unaltered. The response time of the diode will, however, be shortened since the barrier layer capacity decreases as the locking voltage increases.

Photodiodes generally supply relatively small (photo) currents only and are therefore as a rule connected to a downstream amplifier.

Photodiodes, e.g., appropriate germanium photodiodes, silicon photodiodes, etc., may be used for a plurality of different applications, for instance, in systems for the automatic switching on and off of lighting installations.

In this case, a corresponding photodiode or the photodiode and the downstream amplifier, respectively, may be connected to separate evaluation electronics.

The evaluation electronics compare the current/voltage supplied by the photodiode or the downstream amplifier, respectively, with a predetermined threshold value.

If this threshold value is exceeded, the pertinent lighting installation is switched off, so that energy may be saved.

If appropriate standard photodiodes are used in the above-mentioned systems, it is a disadvantage that the (relative) spectral sensitivity of the photodiodes is different vis-à-vis the (relative) spectral sensitivity of the human eye.

This may result in that a lighting installation controlled by such a standard photodiode is, in the case of particular spectral compositions of the light hitting the photodiode, possibly switched off "too late" (i.e. remains in a switched-on state although it is already "sufficiently bright" according to the subjective feeling of the human eye). This results in an unnecessarily high energy consumption.

Furthermore, particular other spectral compositions of the light hitting the photodiode may result in that the pertinent lighting installation is possibly switched off "too early" (i.e. already when it is in fact still "too dark" according to the subjective feeling of the human eye). This may have an adverse effect on security.

For this reason, photodiodes whose (relative) spectral sensitivity is adapted to that of the human eye are used in specific systems.

The above-mentioned separate evaluation electronics downstream the photodiode, however, result in that appropriate photodiode systems can be realized with relatively great effort and/or with relatively large dimensions only.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 illustrates a single chip single semiconductor opto device, in one embodiment, an optothyristor, in accordance with one embodiment.

FIG. 4 illustrates a schematic representation of the basic structure of the optothyristor illustrated in FIG. 3.

DETAILED DESCRIPTION

Figure 1:
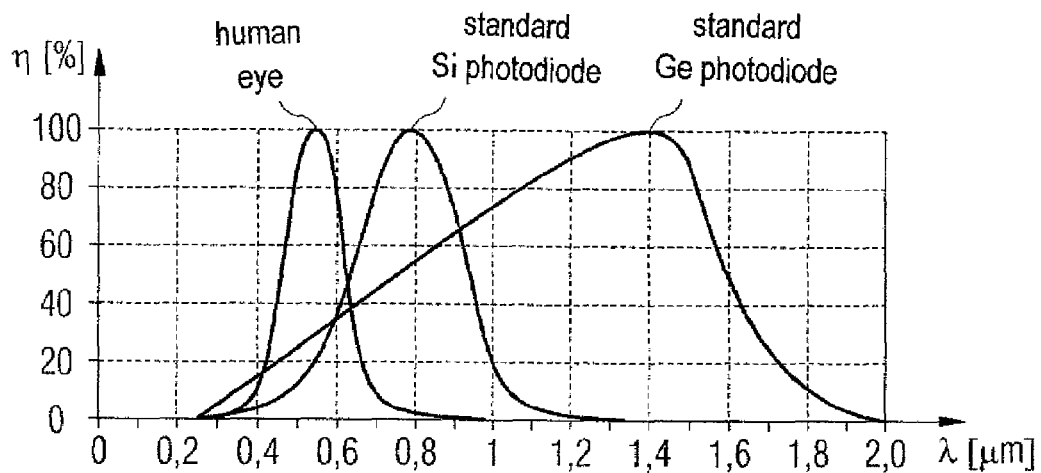
FIG. 1 illustrates a schematic diagram for illustrating the relative spectral sensitivity of the human eye, of a standard germanium photodiode, and of a standard silicon photodiode.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a novel single chip single semiconductor opto device, in one embodiment an optothyristor or optotriac, by which disadvantages of conventional systems can be overcome at least partially.

In accordance with one embodiment, there is provided a single chip single semiconductor opto device, in one embodiment an optothyristor or optotriac, including an optodiode contained in the optothyristor or optotriac, wherein the optodiode has a relative spectral sensitivity that is adapted to the relative spectral sensitivity of an eye, wherein, correspondingly adapted to the spectral sensitivity of the eye, a switch-on or switch-off process of the optothyristor or optotriac is triggered.

In one embodiment, the optodiode contained in the optothyristor or optotriac has a relative spectral sensitivity that is adapted to the relative spectral sensitivity of the human eye, or to the relative spectral sensitivity of an animal eye, etc.

For adapting the relative spectral sensitivity to the relative spectral sensitivity of the respective eye, the optodiode may be coated with at least one radiation filter layer, e.g., with silicon nitride.

In accordance with another embodiment, there is provided a single chip single semiconductor opto device. In one embodiment, the device includes an optothyristor or optotriac. The device includes an optodiode contained in the optothyristor or optotriac, wherein the optodiode contained in the optothyristor or optotriac has a relative spectral sensitivity that is adapted to a respectively desired predetermined relative spectral sensitivity in the UV and/or infrared range.

In accordance with another embodiment, there is provided a single chip single semiconductor device, in one embodiment an opto IGBT or opto MOSFET single semiconductor device, including an optodiode contained in the opto IGBT or opto MOSFET single semiconductor device, wherein the optodiode has a relative spectral sensitivity that is adapted to the relative spectral sensitivity of an eye, e.g., the human eye or an animal eye.

The above-mentioned single chip single semiconductor device—i.e. the above-mentioned optothyristor, optotriac, opto MOSFET, etc.—may, for instance, be used for the automatic switching on and off of lighting installations.

The resulting total system can be realized with distinctly less effort and with considerably smaller dimensions than conventional systems.

FIG. 1 illustrates a schematic diagram for illustrating the relative spectral sensitivity of the human eye, of a standard germanium photodiode (Ge photodiode), and of a standard silicon photodiode (Si photodiode).

The spectral range of conventional standard germanium photodiodes lies, for instance, between approx. 0.25 and 2.0 μm, and the spectral range of conventional standard silicon photodiodes, for instance, between approx. 0.3 and 1.2 μm.

The spectral range of the human eye lies, for instance, between approx. 0.3 and 0.88 μm.

Furthermore, relatively strong differences in the (relative) spectral sensitivity may occur within the corresponding spectral ranges of the human eye and of standard germanium and standard silicon photodiodes.

The human eye is, for instance, strongly sensitive to light with a wavelength of e.g., 0.5 μm—viewed relatively—, and standard germanium and standard silicon photodiodes are only weakly sensitive—viewed relatively.

Vice versa, standard germanium and standard silicon photodiodes are, for instance, strongly sensitive to light with a wavelength of e.g., 0.65 μm—viewed relatively—, and the human eye is only weakly sensitive—viewed relatively.

All this may, for instance, result in that a lighting installation controlled by a conventional standard germanium or standard silicon photodiode is possibly switched off "too late" in the case of particular spectral compositions of the light hitting the photodiode (i.e. remains in a switched-on state although it is already "sufficiently bright" according to the subjective feeling of the human eye), and is possibly switched off "too early" in the case of particular other spectral compositions of the light hitting the photodiode (i.e. already when it is in fact still "too dark" according to the subjective feeling of the human eye).

FIG. 3 illustrates a single chip single semiconductor opto device, in one embodiment an optothyristor single semiconductor device 1 in accordance with one embodiment of the present invention.

The optothyristor single semiconductor device 1 consists of a silicon wafer or a silicon chip 2 including four layers 2a, 2b, 2c, 2d as schematically illustrated in FIG. 4, which are alternately of the n-type and of the p-type.

Two contacts 3a, 3d provided at the outer layers 2a, 2d form corresponding anode and cathode connections, and a contact 3c provided at one of the intermediate layers (here: the intermediate layer 2c) forms the control connection.

After the incorporation of the silicon wafer 2 forming the optothyristor single semiconductor device 1 in an appropriate semiconductor device package, the anode and cathode connections 3a, 3d and the control connection 3c may be connected with respectively corresponding connections or pins at the semiconductor device package.

As results form FIG. 4, the above-mentioned four layers 2a, 2b, 2c, 2d form three pn junctions or barrier layers J1, J2, J3.

Like in the case of conventional optothyristor single semiconductor devices, a silicon wafer 2 cut out of a n-conducting monocrystal may, for instance, be used for the manufacturing of the optothyristor single semiconductor device 1. The barrier layers or junctions J3 and J2 may, for instance, be manufactured by using gallium gas diffusion, and the barrier layer or the junction J1 by appropriate alloy techniques.

The pn junction J2 or the layers 2b, 2c, respectively fulfill, in the case of the optothyristor single semiconductor device 1, like in conventional optothyristor single semiconductor devices, the function of an optodiode.

The diode, however—other than conventional diodes contained in conventional optothyristor single semiconductor devices—does not have a spectral sensitivity corresponding to the relative spectral sensitivity of a standard photodiode illustrated in FIG. 1.

Instead, the relative spectral sensitivity of the optodiode contained in the optothyristor single semiconductor device 1 is—for instance, by the measures explained in more detail below and/or any other measures—adjusted such that it corresponds substantially to the relative spectral sensitivity of the human eye, or alternatively to any other relative spectral sensitivity that is defined by the respective application or is desired or to be adjusted, respectively (cf. below).

An adaptation of the relative spectral sensitivity of the optodiode contained in the optothyristor single semiconductor device 1 is, for instance, of advantage if the optothyristor single semiconductor device 1 is e.g., used for the control of a camera, in particular a digital camera, or for the control of the illumination of a handy display, etc., or for switching on or switching off a lighting installation, etc.

Figure 2:
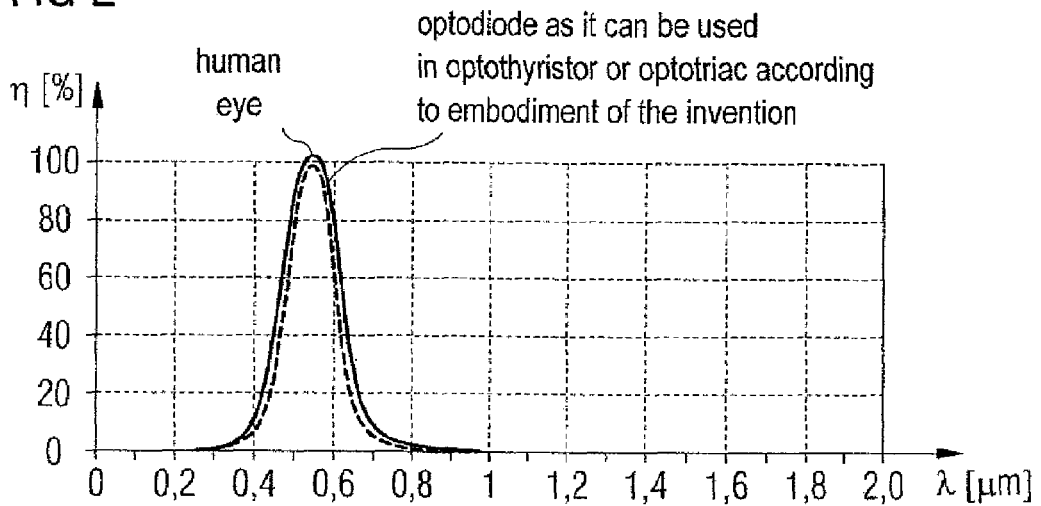
FIG. 2 illustrates a schematic diagram for illustrating the relative spectral sensitivity of the human eye, and of an optodiode contained in an optothyristor or optotriac in accordance with one embodiment.

FIG. 2 illustrates—by way of example—a schematic, idealized diagram for illustrating the relative spectral sensitivity of the human eye, and of the optodiode contained in the optothyristor single semiconductor device 1.

The spectral range of the optodiode contained in the optothyristor single semiconductor device 1 begins approximately at the wavelength at which the optical spectral range of the human eye also begins—e.g., at approx. 0.30 μm or approx. 0.39 μm, e.g., 0.30 or 0.39 μm±25% (or e.g., ±15%), etc. (or alternatively at the respectively desired wavelength that can, for instance, be adjusted in the manners explained in more detail below).

The spectral range of the optodiode contained in the optothyristor single semiconductor device 1 ends at the wavelength at which the optical spectral range of the human eye also ends—e.g., at approx 0.79 μm or approx. 0.88 μm, or e.g., 0.79 or 0.88 μm±25% (or e.g., ±15%), etc. (or at the respectively desired wavelength that can, for instance, be adjusted in the manners explained in more detail below).

Within the respective spectral ranges of the optodiode contained in the optothyristor single semiconductor device 1 and of the human eye the respective relative spectral sensitivities may substantially be equal or—viewed over the entire wavelength spectrum—deviate from each other only relatively weakly, e.g., by at most 50% or 35%, or e.g., by at most 25% or 15%, etc., or the respective relative spectral sensitivity of the optodiode contained in the optothyristor single semiconductor device 1 may, for instance, be adjusted by the measures explained in more detail below, and/or any other measures such that it corresponds substantially to the respectively desired relative spectral sensitivity or the sensitivity to be adjusted (with—viewed over the entire wavelength spectrum—only relatively weak deviations, e.g., by at most 35%, 25%, 15%, etc.).

The relative spectral sensitivity of the optodiode contained in the optothyristor single semiconductor device 1 may, for instance—e.g., by the measures explained in more detail below, and/or any other measures—be adjusted such that it corresponds substantially to the relative spectral sensitivity of an animal eye, e.g., the eye of a cow, a horse, a pig, a hen, a fish, a reptile, or any other animal, in particular production animal, etc.

This is, for instance, in particular of advantage if the optothyristor single semiconductor device 1 is used for the control of a system employed for an animal husbandry and/or animal monitoring installation, e.g., in a stable, at a pasture, at a fish pond, etc., e.g., an appropriate lighting installation.

In further embodiments, the spectral range of the optodiode contained in the optothyristor single semiconductor device 1 may—for instance, by the measures that are explained in more detail below, and/or any other measures—be adjusted such that it begins approximately at the wavelength at which the range of infrared radiation begins, e.g., at approx. 0.79 μm, or e.g., 0.79 μm±25% (or e.g., ±15%), etc. (or alternatively at the respectively desired wavelength that can, for instance, be adjusted in the manners explained in more detail below). Alternatively or additionally, the spectral range of the optodiode contained in the optothyristor single semiconductor device 1 may—for instance, by the measures explained in more detail below, and/or any other measures—be adjusted such that it ends approximately at the wavelength at which the range of the infrared radiation ends, e.g., at approx. 1 mm, or e.g., 1 mm±25% (or e.g., ±15%), etc. (or at the respectively desired wavelength that can, for instance, be adjusted in the manners explained in more detail below).

This is, for instance, in particular of advantage if the optothyristor single semiconductor device 1 is used e.g., for the control of e.g., an infrared lighting installation, e.g., in a photographic laboratory, and/or for the control of an alarm or monitoring system operating in the infrared range, etc.

In further embodiments, the spectral range of the optodiode contained in the optothyristor single semiconductor device 1 may—for instance, by the measures that are explained in more detail below and/or any other measures—be adjusted such that it ends approximately at the wavelength at which the range of the ultraviolet (UV) radiation ends, e.g., at approx. 0.39 μm, or e.g., 0.39 μm±25% (or e.g., ±15%), etc. (or at the respectively desired wavelength that can, for instance, be adjusted in the manners explained in more detail below). The spectral range of the optodiode contained in the optothyristor single semiconductor device 1 may—for instance, by the measures explained in more detail below and/or any other measures—be adjusted such that it begins approximately at the wavelength at which the range of the ultraviolet (UV) radiation begins, e.g., at approx. 10 nm, or e.g., 10 nm±25% (or e.g., ±15%), etc. (or at the respectively desired wavelength that can, for instance, be adjusted in the manners explained in more detail below).

This is in particular of advantage if the optothyristor single semiconductor device 1 is, for instance, used for the control of a UV lighting installation, for instance, and/or for the control of an alarm or monitoring system operating in the UV range, etc., e.g., for flame monitoring in combustion systems, and/or in a sunscreen device (e.g., in UV installations of solariums), etc.

In all of the above-mentioned embodiments (wherein the relative spectral sensitivity of the optodiode contained in the optothyristor single semiconductor device 1 may, for instance, correspond substantially to the relative spectral sensitivity of the human eye or an animal eye, or any other above-mentioned spectral sensitivity), one or a plurality of wavelength ranges may—for instance, by the measures that are explained in more detail below and/or any other measures—additionally be excluded from the respective spectral range; the device 1 has a relatively small relative spectral sensitivity in these—additionally excluded—wavelength ranges, e.g., <20%, in particular <10%, or approximately 0%, etc.

For instance—although the relative spectral sensitivity of the optodiode contained in the optothyristor single semiconductor device 1 corresponds e.g., for the rest substantially to the relative spectral sensitivity of the human eye (as is, for instance, illustrated in FIG. 1 and FIG. 2)—, the relative spectral sensitivity of the optodiode contained in the optothyristor single semiconductor device 1 may—for instance, in the additionally excluded wavelength range between e.g., 0.60 μm and 0.65 μm, etc.—which can, for instance, be adjusted by the measures that are explained in more detail below and/or any other measures—have a relative spectral sensitivity of e.g., <10%, or approx. 0%, etc.

Through this it is, e.g., in the corresponding—excluded— wavelength range, possible to exclude interference signals that may occur more often than average and/or with higher intensity than average from the respective measurement, or to filter them out appropriately, etc.

All of the above-mentioned principles (i.e. all of the above-mentioned individual measures and/or measure combinations) may also be used with any other single semiconductor devices than with the above-explained optothyristor single semiconductor device 1, e.g., with a single chip single semiconductor optotriac, or e.g., with a single chip single semiconductor opto IGBT or opto MOSFET, etc.

A single chip single semiconductor optotriac in accordance with an embodiment of the present invention includes, for instance, in correspondence with conventional optotriacs, two thyristors which each contain one optodiode that corresponds to the above-mentioned optodiode.

A respective one of the two optodiodes or, both optodiodes of the optotriac comprise(s)—other than conventional diodes contained in conventional optotriacs (and like described above for optothyristors)—no spectral sensitivity corresponding to the relative spectral sensitivity of a standard photodiode illustrated in FIG. 1, but a relative spectral sensitivity that is adjusted such that it corresponds substantially to the relative spectral sensitivity of the human eye, or alternatively to any other relative spectral sensitivity that is, for instance, described above—and that is respectively predetermined by the respective application, or that is respectively desired or to be adjusted—, e.g., to that of an animal eye, etc.

Correspondingly, the optodiode contained in a single chip single semiconductor opto IGBT or opto MOSFET, or fulfilling a corresponding function may—other than conventional diodes contained in conventional IGBTs or MOSFETs (and like described above for optothyristors)—include no spectral sensitivity corresponding to the relative spectral sensitivity of a standard photodiode illustrated in FIG. 1, but a relative spectral sensitivity that is adjusted such that it corresponds substantially to the relative spectral sensitivity of the human eye, or alternatively to any other relative spectral sensitivity that is, for instance, described above—and that is respectively predetermined by the respective application, or that is respectively desired or to be adjusted—, e.g., to that of an animal eye, etc.

For adjusting the respectively desired relative spectral sensitivity of the optodiode contained in the respective single semiconductor device 1 (optothyristor, optotriac, opto IGBT, opto MOSFET, etc.), a plurality of different measures—that may also be combined optionally—is conceivable.

The surface of the single semiconductor device 1 may, for instance, be coated with one or a plurality of filter layers, in particular e.g., with one or a plurality of interference filter layers, e.g., corresponding filter layers containing silicon nitride.

Radiation entering the semiconductor device package through a window will then not directly hit the surface of the single semiconductor device 1 or the optodiode contained therein, respectively, but will traverse the one or the plurality of filter layers before.

The single semiconductor device may then—apart from the one or the plurality of filter layers—e.g., be constructed similar or identical to corresponding conventional single semiconductor devices (optothyristor, optotriac, opto IGBT, opto MOSFET, etc.).

By using the one or the plurality of filter layers it may be achieved that the respectively desired relative spectral sensitivity results for the optodiode contained in the respective single semiconductor device 1 (optothyristor, optotriac, opto IGBT, opto MOSFET, etc.)—namely in that the intensity of corresponding spectral portions for which—without a filter layer—a relatively too high relative spectral sensitivity would result in the diode vis-à-vis the relative spectral sensitivity to be respectively adjusted is relatively strongly attenuated by the one or the plurality of filter layers, and in that the intensity of spectral portions for which—without a filter layer—a relatively too low relative spectral sensitivity would result in the diode vis-à-vis the relative spectral sensitivity to be respectively adjusted is relatively weakly or not at all attenuated by the one or the plurality of filter layers.

For instance, as results from FIGS. 1, if—with the use of a conventional optodiode—the relative spectral sensitivity is, for instance, to be adjusted such that it corresponds substantially to the relative spectral sensitivity of the human eye, the filter layer(s) may e.g., be chosen such that it or they permit radiation with a wavelength of up to e.g., approx. 0.5 µm to pass substantially without an attenuation of intensity, and radiation from a wavelength of e.g., more than approx. 0.5 µm such that—the higher the wavelength—the more strongly the intensity is attenuated (until, with wavelengths of greater than approx. 0.8 µm the attenuation of the intensity is finally almost 100%).

A plurality of filter layers may be provided which each attenuate the intensity of radiation in particular—respectively different—wavelength ranges differently strongly (and permit them to pass in the remaining wavelength ranges substantially without attenuation):

For instance—as results from FIG. 1—, with the use of a conventional optodiode, if the relative spectral sensitivity is e.g., to be adjusted such that it corresponds substantially to the relative spectral sensitivity of the human eye, all of the filter layers may, for instance, be chosen such that they permit radiation with a wavelength of up to e.g., approx. 0.5 µm to pass substantially without attenuation of intensity; furthermore, a first of the filter layers may attenuate radiation with a wavelength of e.g., approx. 0.5 µm to approx. 0.6 µm relatively weakly, and a second of the filter layers may attenuate radiation with a wavelength of e.g., approx. 0.6 µm to approx. 0.7 µm relatively strongly, and a third of the filter layers may attenuate radiation with a wavelength of e.g., approx. 0.7 µm to approx. 0.8 µm even more strongly, and a further of the filter layers may attenuate radiation with a wavelength of e.g., more than approx. 0.8 µm substantially completely.

The filter layer(s) provided on the surface of the single semiconductor device 1 itself, one or a plurality of filter layers may also be provided at the semiconductor device package, in particular the above-mentioned window in the package, and/or at any other place between the package and the single semiconductor device.

The surface of the above-mentioned (glass) window may, for instance, be coated with one or a plurality of filter layers, or one or a plurality of filters may be attached to the device package instead of the (glass) window.

Radiation hitting the package will then not arrive directly at the surface of the single semiconductor device 1, but will previously traverse the one or the plurality of filter layers at the package (and possibly additionally the above-mentioned one or plurality of filter layers with which the single semiconductor device 1 may be coated).

The filter layers at the package may fulfill a corresponding function and be equipped correspondingly as indicated above for the filter layers at the single semiconductor device 1.

A The above-mentioned filter layers at the package window and the filter layers at the single semiconductor device 1 may also jointly fulfill the above-mentioned function, so that the respectively desired relative spectral sensitivity results all in all.

For adjusting the respectively desired relative spectral sensitivity (e.g., such that it corresponds substantially to the relative spectral sensitivity of the human eye or of an animal eye, etc.), to the above-mentioned measures—providing of filter layers—one or a plurality of (further) measures—that may also be combined optionally—may be taken.

For instance, a device in which the above-mentioned optodiode contained in the single semiconductor device 1 has been adapted by specific doping and/or coating and/or physical and/or chemical processing such that it includes the respectively desired relative spectral sensitivity may be used as single semiconductor device 1.

In further alternative developments of the invention, not only the respective above-described optothyristor/optotriac/opto IGBT/opto MOSFET is formed on the respective silicon chip 2, but additionally one or a plurality of further devices, e.g., one or a plurality of further optothyristors/optotriacs/opto IGBTs/opto MOSFETS, etc.

These may be designed correspondingly similar to conventional optothyristors/optotriacs/opto IGBTs/opto MOSFETs, or e.g., correspondingly as described above such that, other than with optodiodes contained in conventional optothyristors/optotriacs/opto IGBTs/opto MOSFETs, the optodiode contained in the respective optothyristor/optotriac/opto IGBT/opto MOSFET, etc. does not have a spectral sensitivity corresponding to the relative spectral sensitivity of a standard photodiode illustrated in FIG. 1, but a relative spectral sensitivity that is adjusted such that it corresponds substantially to the relative spectral sensitivity of the human eye, or alternatively to any other relative spectral sensitivity that is, for instance, described above—and that is respectively predetermined by the respective application, or that is respectively desired or to be adjusted—, e.g., to that of an animal eye, etc.

The plurality of optothyristors (or optotriacs or opto IGBTs, opto MOSFETs, etc.) provided on the corresponding microchip may include optodiodes having respectively different relative spectral sensitivities. The microchip may then be designed such that the different optothyristors (or optotriacs or opto IGBTs, opto MOSFETs, etc.) can be switched according to requirements, and that the respectively desired relative spectral sensitivity can thus be selected.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A single chip single semiconductor opto device, comprising:
    an optothyristor or optotriac;
    an optodiode contained in the optothyristor or optotriac;
    wherein the optodiode has a relative spectral sensitivity that is adapted to the relative spectral sensitivity of an eye and is adapted to trigger a switch-on or switch-off process of the optothyristor or optotriac.

2. The device of claim 1, comprising wherein the optodiode has a relative spectral sensitivity that is adapted to the relative spectral sensitivity of the human eye.

3. The s device of claim 1, comprising wherein the optodiode has a relative spectral sensitivity that is adapted to the relative spectral sensitivity of an animal eye.

4. The device of claim 3, comprising wherein the animal eyes is the eye of a production animal.

5. The device of claim 1, comprising wherein the animal eye is the eye of a cow, a horse, a pig, a hen, a reptile, or a fish.

6. The device of claim 1, comprising wherein the optodiode is coated with at least one radiation filter layer for adapting the relative spectral sensitivity to the relative spectral sensitivity of the eye.

7. The device of claim 6, comprising wherein the radiation filter layer contains silicon nitride.

8. A single chip single semiconductor opto device, comprising optothyristor or optotriac, comprising:
    an optodiode contained in the optothyristor or optotriac, wherein the optodiode has a relative spectral sensitivity that is adapted to a predetermined relative spectral sensitivity in the UV and/or infrared range and is configured to trigger a switch-on or switch-off process of the optothyristor or optotriac.

9. A single chip opto IGBT or opto MOSFET single semiconductor device, comprising:
    an optodiode contained in the opto IGBT or opto MOSFET single semiconductor device, and having a relative spectral sensitivity that is adapted to the relative spectral sensitivity of an animal eye, and which is configured to trigger a switch-on or switch-off process of the opto IGBT or opto MOSFET single semiconductor device.

10. The device of claim 9, comprising wherein the optodiode has a relative spectral sensitivity that is adapted to the relative spectral sensitivity of the human eye.

11. The device of claim 9, comprising wherein the optodiode has a relative spectral sensitivity that is adapted to the relative spectral sensitivity of an animal eye.

12. A microchip with a plurality of devices comprising:
    at least one optothyristor or optotriac with an optodiode contained in the optothyristor or optotriac, wherein the optodiode has a relative spectral sensitivity that is adapted to the relative spectral sensitivity of an eye and is configured a switch-on or switch-off process of the orptothryristor or optotriac; and
    one or a plurality of further devices, in particular an evaluation and/or amplification and/or control circuit.

13. A microchip comprising:
    a plurality of optothyristors or optotriacs, each comprising an optodiode contained in the respective optothyristor or optotriac, wherein the optodiodes each have different relative spectral sensitivities and are configured to trigger a switch-on or switch-off process of the corresponding optohyristor or optotriac; and
    a switch for selecting, according to relative spectral sensitivity requirements of the microchip, between optothyristors or optotriacs with optodiodes having different relative spectral sensitivities.

14. The microchip of claim 13, comprising wherein at least one of the optodiodes has a relative spectral sensitivity that is adapted to the relative spectral sensitivity of an eye.

* * * * *